United States Patent
Lee et al.

(10) Patent No.: US 8,456,003 B2
(45) Date of Patent: Jun. 4, 2013

(54) PACKAGE SUBSTRATE CAPABLE OF CONTROLLING THE DEGREE OF WARPAGE

(75) Inventors: Dong Gyu Lee, Gyunggi-do (KR); Dae Young Lee, Gyunggi-do (KR); Tae Joon Chung, Seoul (KR); Seon Jae Mun, Gyunggi-do (KR); Jin Won Choi, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 196 days.

(21) Appl. No.: 12/926,314

(22) Filed: Nov. 9, 2010

(65) Prior Publication Data
US 2011/0186991 A1    Aug. 4, 2011

(30) Foreign Application Priority Data
Dec. 8, 2009   (KR) .................. 10-2009-0121098

(51) Int. Cl.
*H01L 2225/06513*   (2006.01)
*H01L 2224/9201*   (2006.01)
*H01L 2225/06517*   (2006.01)

(52) U.S. Cl.
USPC .......................................... 257/737; 257/738

(58) Field of Classification Search
USPC ........................................................ 257/737
See application file for complete search history.

(56) References Cited

U.S. PATENT DOCUMENTS

| | | | | |
|---|---|---|---|---|
| 5,269,453 | A | * | 12/1993 | Melton et al. ............ 228/180.22 |
| 6,742,247 | B2 | * | 6/2004 | Pai et al. ........................ 29/829 |
| 6,878,633 | B2 | * | 4/2005 | Raskin et al. ................. 438/694 |
| 2009/0184411 | A1 | | 7/2009 | Chung et al. |

FOREIGN PATENT DOCUMENTS

| | | |
|---|---|---|
| JP | 2007-506284 | 3/2007 |
| KR | 10-2007-0082998 | 8/2007 |
| KR | 10-2008-0080365 | 3/2008 |
| KR | 10-2009-0080752 | 7/2009 |
| WO | 2007/097507 A1 | 8/2007 |

OTHER PUBLICATIONS

Korean Office Action mailed Jan. 31, 2012 issued in corresponding Korean Patent Application No. 10-2009-0121098.

* cited by examiner

*Primary Examiner* — Eva Yan Montalvo

(57) ABSTRACT

There is provided a package substrate capable of controlling the degree of warpage thereof by improving the composition and formation of a post terminal and a method of fabricating the same. The package substrate includes a substrate having at least one conductive pad; an insulating layer provided on the substrate and having an opening to expose the conductive pad; a separation barrier layer provided on the conductive pad inside the opening and formed to be higher than the upper surface of the insulating layer along the side walls thereof; a post terminal provided on the separation barrier layer; and a solder bump provided on the post terminal.

6 Claims, 4 Drawing Sheets

US 8,456,003 B2

PACKAGE SUBSTRATE CAPABLE OF CONTROLLING THE DEGREE OF WARPAGE

CROSS-REFERENCE TO RELATED APPLICATIONS

This application claims the priority of Korean Patent Application No. 10-2009-0121098 filed on Dec. 8, 2009, in the Korean Intellectual Property Office, the disclosure of which is incorporated herein by reference.

BACKGROUND OF THE INVENTION

1. Field of the Invention

The present invention relates to a package substrate and a method of fabricating the same, and more particularly, to a package substrate capable of controlling the degree of warpage thereof by improving the composition and formation of a post terminal and a method of fabricating the same.

2. Description of the Related Art

A flip chip package has solder bumps formed on a chip and a substrate in contact with each other.

With an increase in data processing capacity and the trend for lighter, thinner, shorter and smaller semiconductors, a flip chip package used for high-speed large-capacity data processing has a gradually decreased bump pitch.

The change of the flip chip package under the above trend causes a problem of deteriorating bump reliability, and accordingly the improvement thereof is required.

Conventionally, in order to improve contact reliability between bumps formed on a substrate and a chip, the bump formed on the chip has been formed of copper having a greater mechanical strength and being more stable than solder and the bump formed on the substrate has been formed to have a copper post structure.

Solder is generally used for the contact between bumps formed on a chip and a substrate. The solder is printed or plated on a copper post formed on the substrate. However, such a copper post has some problems. The copper post is easily oxidized and has a great degree of hardness, so it is susceptible to cracking or short circuiting when warpage between the substrate and the chip occurs.

Accordingly, there has been an attempt to replace the copper post with various metallic alloys. However, when a post is formed of such a metallic alloy, separation between a metal seed layer and a dry film has occurred, and accordingly, an undesired plating of an insulating layer may be performed or a desired plating of a pad may not be performed.

SUMMARY OF THE INVENTION

An aspect of the present invention provides a package substrate capable of controlling the degree of warpage thereof by improving the composition and formation of a post terminal and a method of fabricating the same.

According to an aspect of the present invention, there is provided a package substrate including: a substrate having at least one conductive pad; an insulating layer provided on the substrate and having an opening to expose the conductive pad; a separation barrier layer provided on the conductive pad inside the opening and formed to be higher than the upper surface of the insulating layer along the side walls thereof; a post terminal provided on the separation barrier layer; and a solder bump provided on the post terminal.

The separation barrier layer may have a cup shape corresponding to a shape of the opening.

The separation barrier layer may be formed of copper.

The separation barrier layer may further include a plating seed layer at a bottom thereof.

The separation barrier layer and the post terminal may be formed by electroplating.

The post terminal may be formed of an alloy of tin and copper.

The copper may be contained in a content of 0.2 wt % to 4 wt %.

The solder bump may be formed of an alloy of tin and bismuth.

According to another aspect of the present invention, there is provided a method of fabricating a package substrate, the method including: preparing a substrate having at least one conductive pad; forming an insulating layer having an opening to expose the conductive pad on the substrate; forming a separation barrier layer on the conductive pad inside the opening to be higher than the upper surface of the insulating layer along the side walls thereof; forming a post terminal on the separation barrier layer; and forming a solder bump on the post terminal.

The method may further include, before the forming of the separation barrier layer, forming a plating seed layer on the insulating layer, and forming a dry film pattern on the plating seed layer in order to form the separation barrier layer.

The forming of the dry film pattern may include forming a dry film resist on the plating seed layer, and forming the dry film pattern by exposing the dry film resist to light and developing the dry film resist.

The separation barrier layer may have a cup shape corresponding to a shape of the opening.

The separation barrier layer may be formed of copper.

The separation barrier layer and the post terminal may be formed by electroplating.

The post terminal may be formed by electroplating at a current density of 0.5 ASD(A/dm2) to 3 ASD(A/dm2) so that particles forming the post terminal have a small size.

The post terminal may be formed of an alloy of tin and copper.

The copper may be contained in a content of 0.2 wt % to 4 wt %.

The solder bump may be formed of an alloy of tin and bismuth.

The method may further include reflowing the solder bump after the forming of the solder bump.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
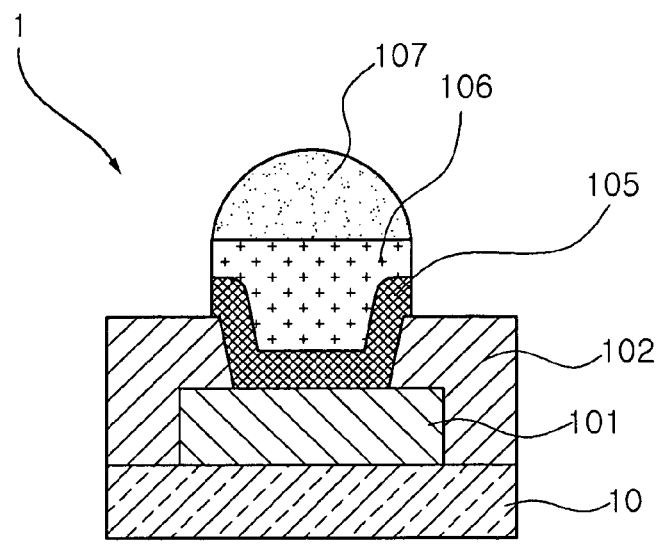
FIG. 1 is a schematic cross-sectional view illustrating a package substrate according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Hereinafter, a package substrate according to an exemplary embodiment of the present invention will be described with reference to FIG. 1.

FIG. 1 is a schematic cross-sectional view illustrating a package substrate according to an exemplary embodiment of the present invention.

A package substrate 1 according to this embodiment includes a substrate 10 having at least one conductive pad 101, an insulating layer 102 provided on the substrate 10 and having an opening O to expose the conductive pad 101, a separation barrier layer 105 formed on the conductive pad 101 inside the opening O and formed to be higher than the upper surface of the insulating layer 102 along the side walls of the insulating layer 102, a post terminal 106 formed on the separation barrier layer 105, and a solder bump 107 formed on the post terminal 106.

Here, the separation barrier layer 105 may have a cup shape corresponding to the shape of the opening O and may be formed of copper.

Also, the separation barrier layer 105 may further include a plating seed layer 103 at the bottom thereof. The plating seed layer 103 may be a chemical copper plating layer formed by electroless plating. The plating seed layer 103 serves as an electrode for the separation barrier layer 105 and the post terminal 106 that are formed by electroplating. However, a method of forming the separation barrier layer 105 and the post terminal 106 is not limited thereto. The separation barrier layer 105 and the post terminal 106 may be formed by electroless plating without the forming of the plating seed layer 103.

The separation barrier layer 105 is formed on the conductive pad 101 inside the opening O and is formed to be higher than the upper surface of the insulating layer 102 along the side walls thereof. The separation barrier layer 105 may prevent a plating solution for the forming of the post terminal 106 from passing through an interface between the insulating layer 102 and a dry film pattern (not shown, see FIGS. 2D through 2H), and accordingly, the separation of the dry film pattern may be prevented in advance. Therefore, the separation barrier layer 105 may serve to allow a plating layer to be formed in a user's desired position and prevent a plating layer from being formed in a user's undesired position.

The post terminal 106 may be formed on the separation barrier layer 105 by electroplating. The post terminal 106 may be formed of an alloy of tin and copper. Here, the copper content may be within a range of 0.2 wt % to 4 wt %. Instead of a post terminal formed of copper which has been conventionally used, the usage of the post terminal 106 formed of the alloy of tin and copper may allow for the fabrication of the package substrate 1 capable of controlling the degree of warpage thereof due to the characteristics of the alloy of tin and copper, i.e., having greater ductility than copper.

The solder bump 107 is formed on the separation barrier layer 105. The solder bump 107 may be formed of an alloy of tin and bismuth. In the case that the solder bump 107 is formed of the alloy of tin and bismuth having a lower melting point than the alloy of tin and copper forming the post terminal 106, the melting of the post terminal 106 may be prevented while the solder bump 107 is formed by reflowing.

Hereinafter, a method of fabricating a package substrate according to an exemplary embodiment of the present invention will be described with reference to FIGS. 2A through 2I.

FIGS. 2A through 2I are schematic cross-sectional views illustrating processes of fabricating a package substrate according to an exemplary embodiment of the present invention.

A method of fabricating the package substrate 1 according to this embodiment includes: preparing the substrate 10 including at least one conductive pad 101; forming the insulating layer 102 having the opening O to expose the conductive pad 101 on the substrate 10; forming the separation barrier layer 105 on the conductive pad 101 inside the opening O to be higher than the upper surface of the insulating layer 102 along the side walls of the insulating layer 102; forming the post terminal 106 on the separation barrier layer 105; and forming the solder bump 107 on the post terminal 106.

Figure 2A:
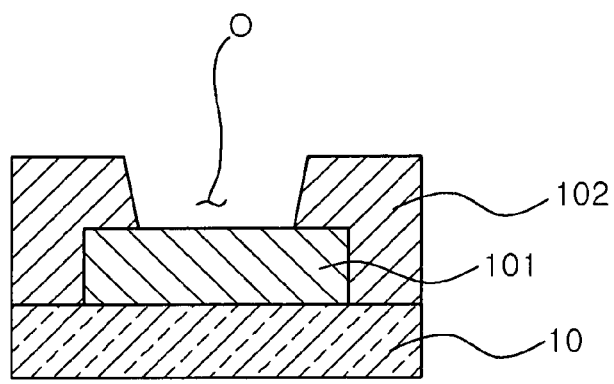
FIGS. 2A through 2I are schematic cross-sectional views illustrating the process of fabricating a package substrate according to an exemplary embodiment of the present invention.

As shown in FIG. 2A, the insulating layer 102 having the opening O is formed on the substrate 10 having at least one conductive pad 101 such that the opening O exposes the conductive pad 101. The insulating layer 102 may be formed of photosensitive solder resist. The solder resist is applied, exposed to light, and developed, thereby forming the insulating layer 102.

Figure 2B:
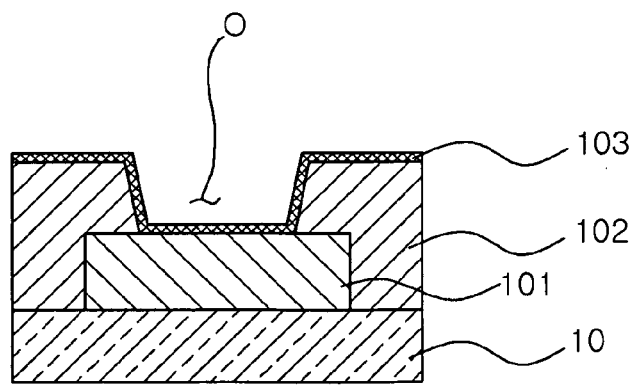

Next, as shown in FIG. 2B, the plating seed layer 103 is formed on the insulating layer 102 having the opening O. The plating seed layer 103 may be a chemical copper plating layer formed by electroless plating. The plating seed layer 103 serves as an electrode for the separation barrier layer 105 and the post terminal 106 that are formed by electroplating.

Figure 2C:
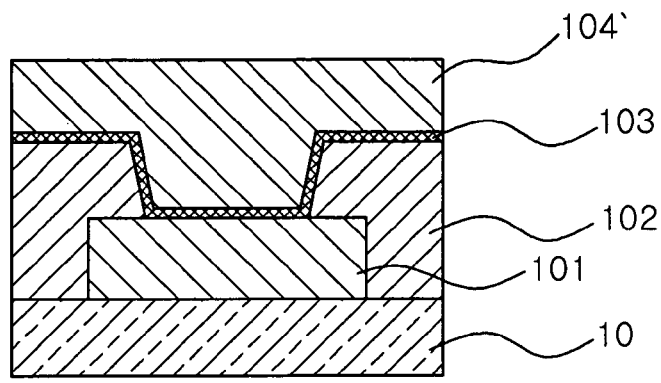
Figure 2D:
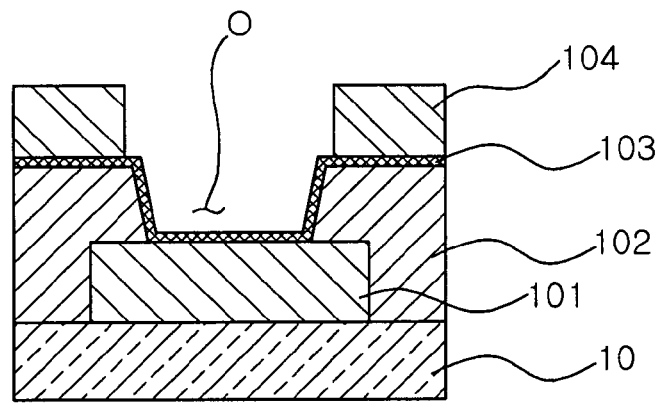

Then, as shown in FIG. 2C, a dry film resist 104' is formed on the plating seed layer 103. After that, the dry film resist 104' is exposed to light and developed, thereby forming a dry film pattern 104 as shown in FIG. 2D.

Figure 2E:
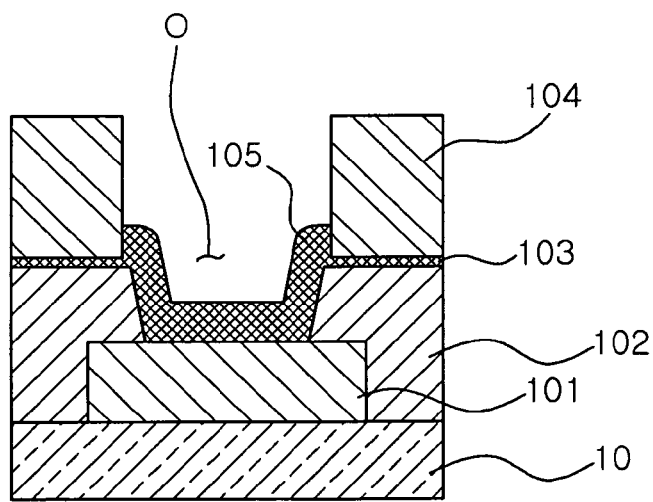

Then, as shown in FIG. 2E, the separation barrier layer 105 is formed on the conductive pad 101 inside the opening O to be higher than the upper surface of the insulating layer 102 along the side walls thereof.

Here, the separation barrier layer 105 may have a cup shape corresponding to the shape of the opening O and may be formed of copper.

Also, the separation barrier layer 105 may be formed by electroplating while using the plating seed layer 103 as an electrode.

The separation barrier layer 105 may prevent a plating solution for the forming of the post terminal 106 from passing through an interface between the insulating layer 102 and the dry film pattern 104, and accordingly the separation of the dry film pattern 104 may be prevented in advance. Therefore, the separation barrier layer 105 may serve to allow a plating layer to be formed in a user's desired position and prevent a plating layer from being formed in a user's undesired position.

Figure 2F:
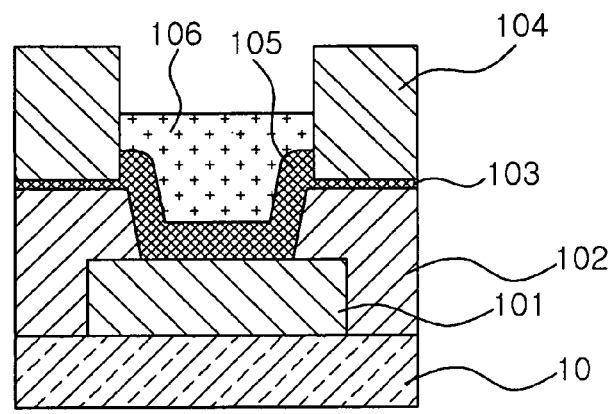

Then, as shown in FIG. 2F, the post terminal 106 is formed on the separation barrier layer 105. The post terminal 106 may be formed by electroplating and may be formed of an alloy of tin and copper. Here, the copper may be contained in a content of 0.2 wt % to 4 wt %. Instead of a post terminal formed of copper which has been conventionally used, the usage of the post terminal 106 formed of the alloy of tin and copper may allow for the fabrication of the package substrate 1 capable of controlling the degree of warpage thereof, due to the characteristics of the alloy of tin and copper, i.e., having greater ductility than copper.

Here, the separation barrier layer 105 and the post terminal 106 are formed by electroplating. However, a method of forming the separation barrier layer 105 and the post terminal 106 is not limited thereto. The separation barrier layer 105 and the post terminal 106 may be formed by electroless plating without the forming of the plating seed layer 103.

The post terminal 106 may be formed by electroplating at a current density ranging from 0.5 ASD(A/dm2) to 3 ASD(A/dm2) so that particles forming the post terminal have a small size. When a high current density is applied during the forming of the alloy of tin and copper, as the particle size of the alloy increases, volume expansion is caused accordingly. As a result, the separation of the dry film pattern 104 may be induced. Therefore, it is required to form the post terminal 106 with small particles by electroplating at a current density of 0.5 ASD(A/dm2) to 3 ASD(A/dm2).

Figure 2G:
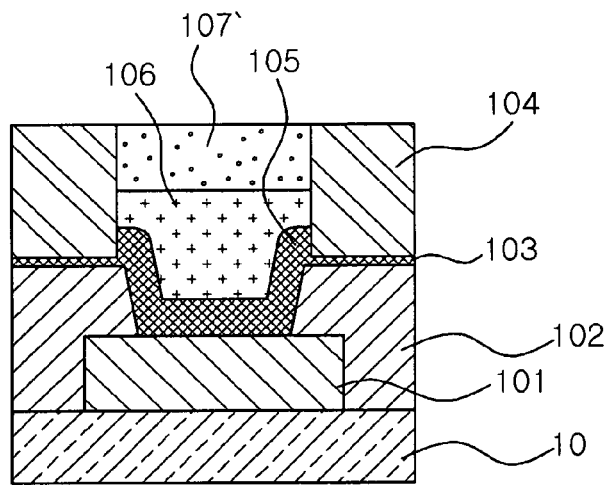

Then, as shown in FIG. 2G, a solder paste 107' is printed on the post terminal 106.

Figure 2H:
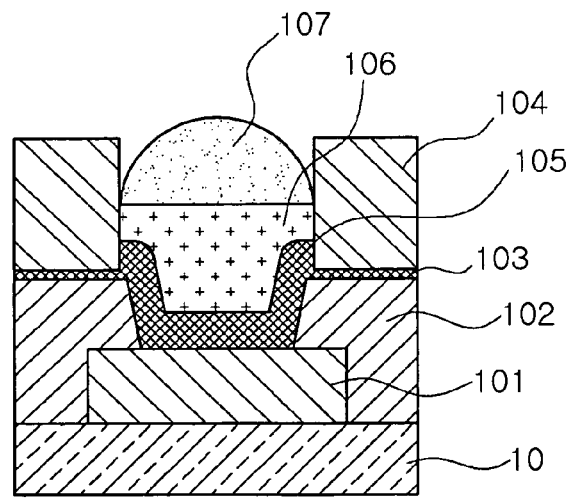

Then, as shown in FIG. 2H, the solder paste 107' is reflowed, thereby forming the solder bump 107.

The solder bump 107 may be formed of an alloy of tin and bismuth. In the case that the solder bump 107 is formed of the alloy of tin and bismuth having a lower melting point than the alloy of tin and copper forming the post terminal 106, the melting of the post terminal 106 may be prevented while the solder bump 107 is formed by reflowing.

Figure 2I:
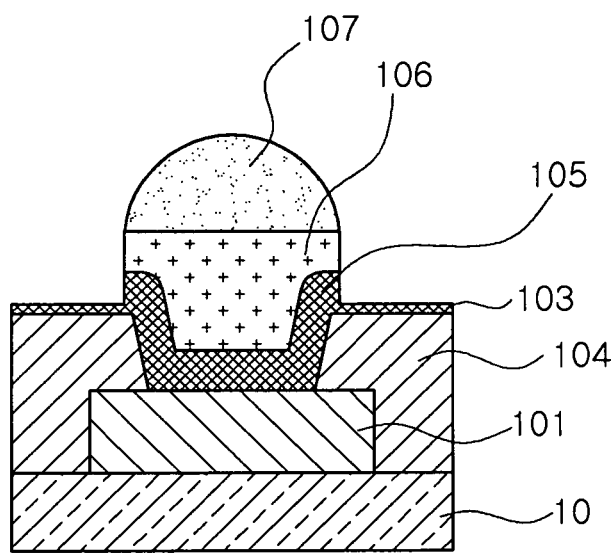

Then, as shown in FIG. 2I, the dry film pattern 104 is removed. After that, the plating seed layer 103 formed at the bottom of the dry film pattern 104 is also removed. Finally, the fabrication of the package substrate 1 as shown in FIG. 1 is completed.

As set forth above, according to exemplary embodiments of the invention, a package substrate capable of controlling the degree of warpage thereof by improving the composition and formation of a post terminal and a method of fabricating the same may be provided.

Also, the separation of a dry film pattern during a plating process is prevented in advance, and thus a user is able to perform the plating process in only a desired position, not in an undesired position.

Furthermore, a solder bump is formed of a material having a lower melting point than a material forming a post terminal, and thus the melting of the post terminal may be prevented during the reflowing of the solder bump.

While the present invention has been shown and described in connection with the exemplary embodiments, it will be apparent to those skilled in the art that modifications and variations can be made without departing from the spirit and scope of the invention as defined by the appended claims.

What is claimed is:

1. A package substrate comprising:
    a substrate having at least one conductive pad;
    an insulating layer provided on the substrate and having an opening to expose the conductive pad;
    a separation barrier layer provided on the conductive pad inside the opening and formed to be higher than the upper surface of the insulating layer along the side walls thereof;
    a post terminal provided on the separation barrier layer, the post terminal being formed of an alloy of tin and copper, the copper being contained in a content of 0.2 wt % to 4 wt %; and
    a solder bump provided on the post terminal.

2. The package substrate of claim 1, wherein the separation barrier layer has a cup shape corresponding to a shape of the opening.

3. The package substrate of claim 1, wherein the separation barrier layer is formed of copper.

4. The package substrate of claim 1, wherein the separation barrier layer further comprises a plating seed layer at a bottom thereof.

5. The package substrate of claim 1, wherein the separation barrier layer and the post terminal are formed by electroplating.

6. The package substrate of claim 1, wherein the solder bump is formed of an alloy of tin and bismuth.

* * * * *